United States Patent
Murata et al.

(10) Patent No.: US 10,573,570 B2
(45) Date of Patent: Feb. 25, 2020

(54) SEMICONDUCTOR DEVICE AND POWER CONVERSION DEVICE

(71) Applicant: Mitsubishi Electric Corporation, Tokyo (JP)

(72) Inventors: Daisuke Murata, Tokyo (JP); Hiroshi Yoshida, Tokyo (JP); Satoshi Kondo, Tokyo (JP); Shinsuke Asada, Tokyo (JP); Yusuke Kaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/132,119

(22) Filed: Sep. 14, 2018

(65) Prior Publication Data
US 2019/0164857 A1 May 30, 2019

(30) Foreign Application Priority Data

Nov. 30, 2017 (JP) .................................. 2017-230006

(51) Int. Cl.
*H01L 23/24* (2006.01)
*H01L 23/08* (2006.01)
(Continued)

(52) U.S. Cl.
CPC .............. *H01L 23/08* (2013.01); *H01L 23/24* (2013.01); *H02M 7/003* (2013.01); *H01L 23/053* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/291* (2013.01);
(Continued)

(58) Field of Classification Search
CPC ......... H01L 23/08; H01L 23/24; H01L 24/32; H01L 2224/48091; H01L 2224/32225; H01L 2224/291; H01L 2924/1033; H01L 24/29; H01L 2224/49109; H01L 2224/48227; H01L 2224/73265; H01L 24/48; H01L 2924/10272; H01L 2924/19107; H01L 24/73; H01L 24/49; H01L 2224/4909; H01L 23/053; H02M 7/003
See application file for complete search history.

(56) References Cited

U.S. PATENT DOCUMENTS

2005/0224818 A1* 10/2005 Harada .................. H01L 33/508
257/79
2007/0058357 A1* 3/2007 Yamaguchi ............. F21K 9/232
362/84
2014/0124936 A1 5/2014 Yanagawa et al.

FOREIGN PATENT DOCUMENTS

JP  2013-004729 A  1/2013

* cited by examiner

*Primary Examiner* — David Vu
(74) *Attorney, Agent, or Firm* — Studebaker & Brackett PC

(57) ABSTRACT

The object of the present invention is to provide a semiconductor device capable of reducing the influence of gas generated from a resin to which a fire retardant is not added, and a power conversion device including the semiconductor device. The semiconductor device according to the present invention includes: a semiconductor element disposed on an insulating substrate; a case disposed around an outer edge of the insulating substrate, the case including an opening facing the semiconductor element; a sealing resin sealing the semiconductor element in the case; and a lid closing the opening of the case, wherein the sealing resin does not contain a fire retardant, the lid contains the fire retardant, and a space is provided between the sealing resin and the lid.

8 Claims, 4 Drawing Sheets

(51) Int. Cl.
  *H02M 7/00* (2006.01)
  *H01L 23/053* (2006.01)
  *H01L 23/00* (2006.01)
(52) U.S. Cl.
  CPC ............... *H01L 2224/32225* (2013.01); *H01L 2224/48091* (2013.01); *H01L 2224/48227* (2013.01); *H01L 2224/4909* (2013.01); *H01L 2224/49109* (2013.01); *H01L 2224/73265* (2013.01); *H01L 2924/1033* (2013.01); *H01L 2924/10272* (2013.01); *H01L 2924/19107* (2013.01)

F I G. 7
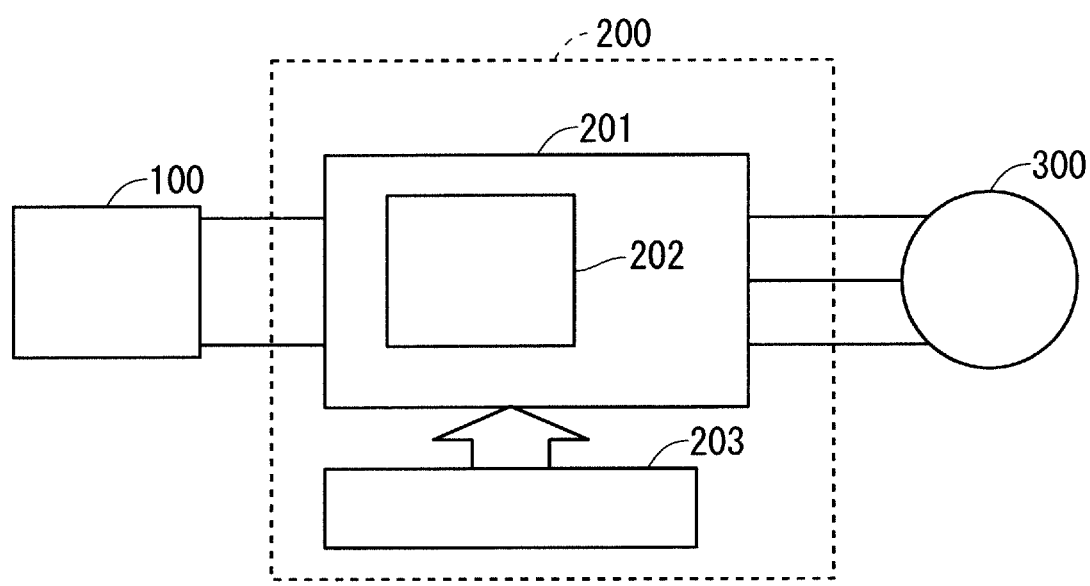

SEMICONDUCTOR DEVICE AND POWER CONVERSION DEVICE

BACKGROUND OF THE INVENTION

Field of the Invention

The present invention relates to a semiconductor device and a power conversion device, and particular to a power semiconductor device.

Description of the Background Art

The conventional semiconductor devices have a circuit pattern on an insulating substrate, and include a semiconductor element on the circuit pattern via a solder. The semiconductor element is sealed by an epoxy resin to which a fire retardant is added. The epoxy resin to which the fire retardant is added is degraded when an operating temperature of the semiconductor element sealed by the epoxy resin reaches a high temperature, for example, 175° C. This causes a problem with decrease in the heat resistance of the epoxy resin and thus shortening the life of the semiconductor device.

To take countermeasures against the problem, for example, Japanese Patent Application Laid-Open No. 2013-4729 discloses a semiconductor device in which a semiconductor element is sealed by a resin to which a fire retardant is not added and the resin to which the fire retardant is not added is sealed by a resin to which a fire retardant is added to support an operation at a temperature higher than the conventional one.

According to this Japanese Patent Application Laid-Open No. 2013-4729, when the semiconductor element is operated and reaches a high temperature, the resin which seals the semiconductor element and to which the fire retardant is not added is exposed to the high temperature to generate gas. The stress caused by the gas generated in such a manner creates a problem with, for example, cracks in the resin to which the fire retardant is not added and in the resin to which the fire retardant is added. Although reducing the influence of the gas generated from the resin to which the fire retardant is not added is preferred, the influence of the gas has not conventionally been considered.

SUMMARY

The object of the present invention is to provide a semiconductor device capable of reducing the influence of gas generated from a resin to which a fire retardant is not added, and a power conversion device including the semiconductor device. The semiconductor device according to the present invention includes: a semiconductor element disposed on an insulating substrate; a case disposed around an outer edge of the insulating substrate, the case including an opening facing the semiconductor element; a sealing resin sealing the semiconductor element in the case; and a lid closing the opening of the case, wherein the sealing resin does not contain a fire retardant, the lid contains the fire retardant, and a space is provided between the sealing resin and the lid.

BRIEF DESCRIPTION OF THE DRAWINGS

FIG. 7 is a block diagram illustrating a configuration of a power conversion system applying the power conversion device according to Embodiment 4 of the present invention.

DESCRIPTION OF THE PREFERRED EMBODIMENTS

Embodiments according to the present invention will be hereafter described based on the drawings.

Embodiment 1

Figure 1:
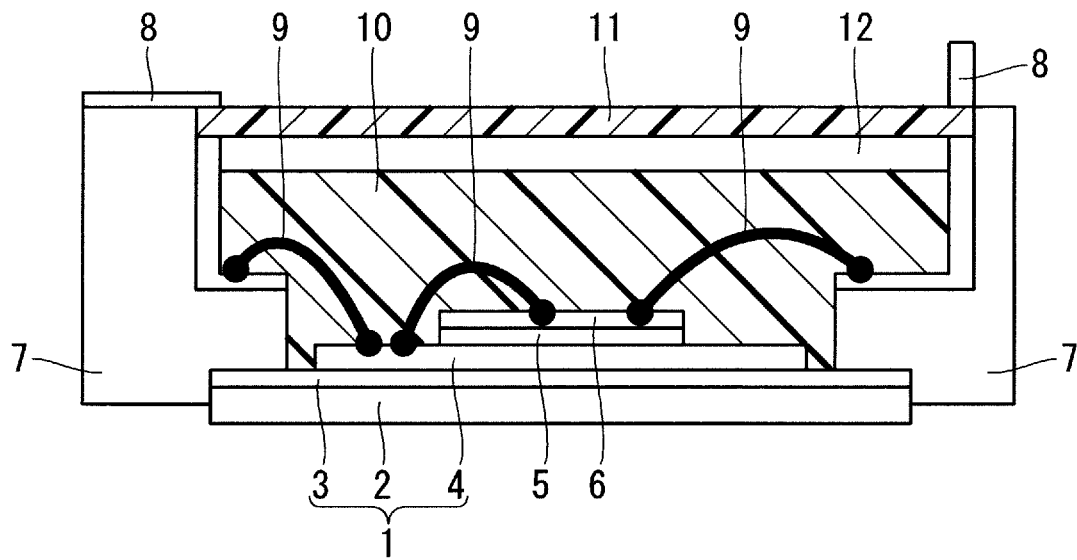
FIG. 1 is a sectional view illustrating an example structure of a semiconductor device according to Embodiment 1 of the present invention.

FIG. 1 is a sectional view illustrating an example structure of a semiconductor device according to Embodiment 1 of the present invention.

An insulating substrate 1 includes a metal plate 2, an insulating layer 3 disposed on the metal plate 2, and a circuit pattern 4 disposed on the insulating layer 3. A semiconductor element 6 is disposed on the circuit pattern 4 via a solder 5. The semiconductor element 6 contains at least SiC or GaN.

A case 7 is disposed around an outer edge of the insulating substrate 1, and is bonded to the insulating substrate 1 with, for example, an adhesive. The case 7 includes an opening facing the semiconductor element 6. The case 7 is provided with an external connection terminal 8. The semiconductor element 6 is electrically connected to the external connection terminal 8 via a wire 9.

A sealing resin 10 seals the semiconductor element 6 in the case 7. A fire retardant is not added to the sealing resin 10. A lid 11 is put to close the opening of the case 7. The lid 11 contains a resin to which a fire retardant is added. The lid 11 and the sealing resin 10 have a space 12 in between. The distance of the space 12 between the lid 11 and the sealing resin 10 may be larger than or equal to the maximum warpage of the semiconductor device, for example, 200 μm or more.

According to Embodiment 1, the space 12 provided between the sealing resin 10 to which the fire retardant is not added and the lid 11 to which the fire retardant is added can trap the gas generated, when the semiconductor element is operated at a higher temperature, from the sealing resin 10 to which the fire retardant is not added. This enables the influence of the gas generated from the sealing resin 10 to which the fire retardant is not added to be reduced as the whole semiconductor device, and the reliability of the semiconductor device to be increased.

To discharge the gas generated from the sealing resin 10 to which the fire retardant is not added outside of the semiconductor device, a space may be provided in a portion where the case 7 is in contact with the lid 11.

Embodiment 2

Figure 2:
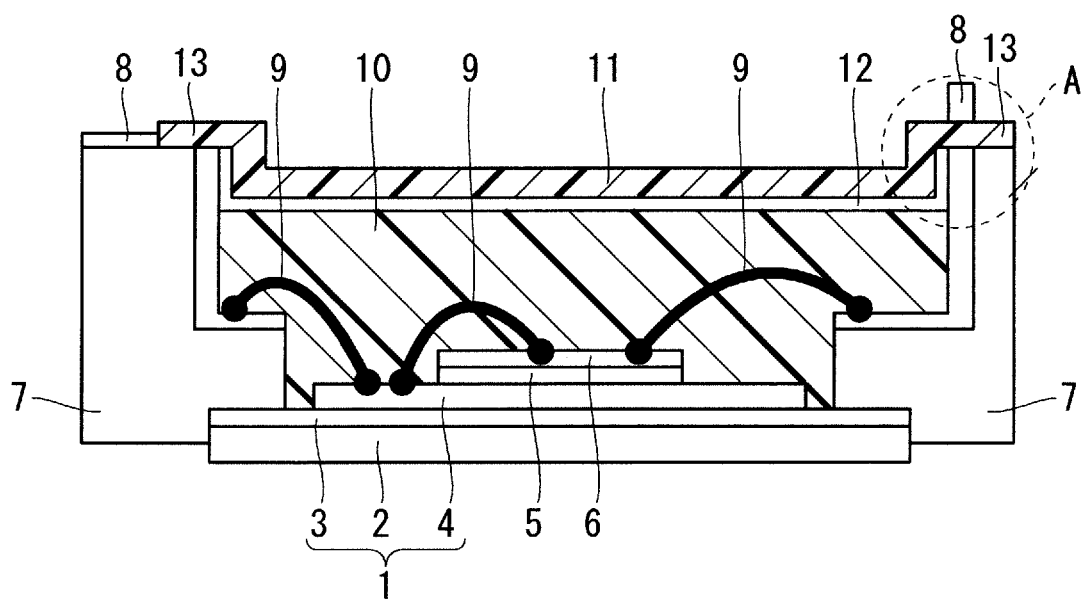
FIG. 2 is a sectional view illustrating an example structure of a semiconductor device according to Embodiment 2 of the present invention.

FIG. 2 is a sectional view illustrating an example structure of a semiconductor device according to Embodiment 2 of the present invention.

Embodiment 2 features a protruding portion 13 that is a first protruding portion of the lid 11. The protruding portion 13 is in contact with the case 7 in an extension direction of the lid 11. Since the other structures are identical to those in Embodiment 1, the detailed description will be omitted herein.

As illustrated in FIG. 2, the protruding portion 13 of the lid 11 is disposed on the upper surface of the case 7. Such a structure can facilitate adjustment of the position of the lid 11, which enables the size of the space 12 between the lid 11 and the sealing resin 10 to be easily controlled. The protruding portion 13 may be shaped like, for example, a cylinder, a quadrangular prism, or a triangle.

As described above, provision of the protruding portion 13 with the lid 11 enables the size of the space 12 between the lid 11 and the sealing resin 10 to be easily controlled according to Embodiment 2. This also facilitates design of the outside shape of the semiconductor device.

The protruding portion 13 may be formed entirely or partially around the case 7. When the protruding portion 13 is formed partially around the case 7, the protruding portion 13 is preferably formed on at least three parts of the case 7. To discharge the gas generated from the sealing resin 10 to which the fire retardant is not added outside of the semiconductor device, a space may be provided in a portion where the case 7 is in contact with the lid 11.

Figure 3:
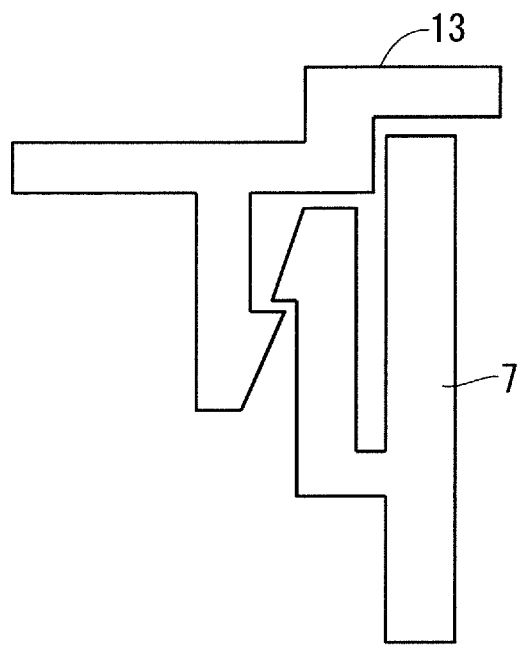
FIG. 3 is an enlarged view of a region A in FIG. 2.

As illustrated in FIG. 3, the protruding portion 13 and the case 7 may have respective claw portions. Engaging the claw portion of the protruding portion 13 in the claw portion of the case 7 will improve the workability. Each of the claw portions may be formed entirely or partially around the case 7. When each of the claw portions is formed partially around the case 7, the claw portion is preferably formed at at least three parts of the case 7. To discharge the gas generated from the sealing resin 10 to which the fire retardant is not added outside of the semiconductor device, a space may be provided in a portion where the case 7 is in contact with the lid 11.

Embodiment 3

Figure 4:
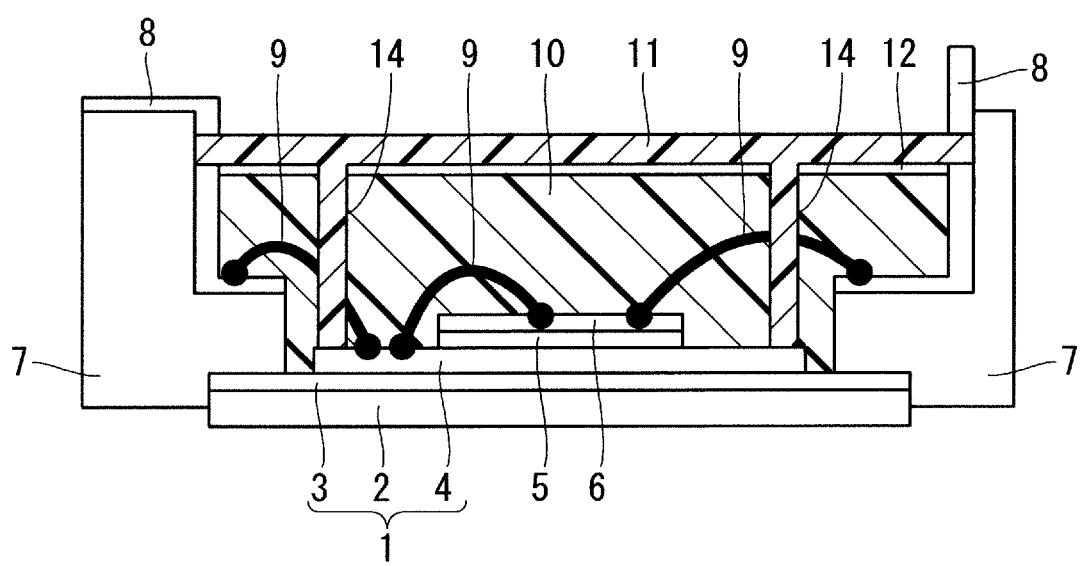
FIG. 4 is a sectional view illustrating an example structure of a semiconductor device according to Embodiment 3 of the present invention.
Figure 5:
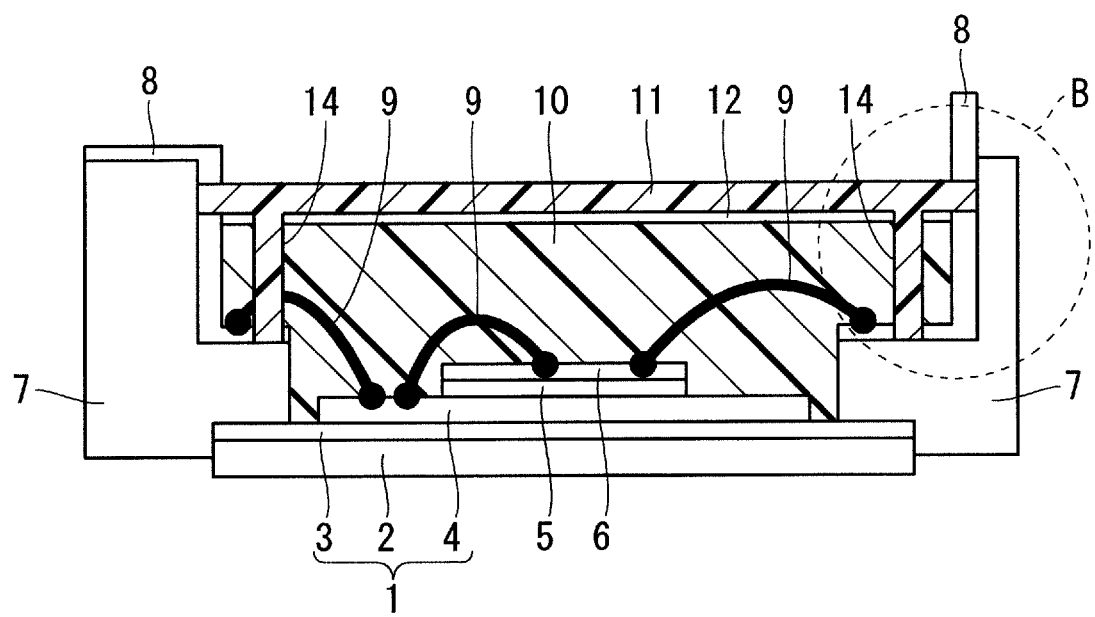
FIG. 5 is a sectional view illustrating an example structure of a semiconductor device according to Embodiment 3 of the present invention.

FIGS. 4 and 5 are sectional views each illustrating an example structure of a semiconductor device according to Embodiment 3 of the present invention.

Embodiment 3 features a protruding portion 14 that is a second protruding portions protruding from the lid 11 in a direction vertical to the extension direction of the lid 11. The protruding portion 14 is in contact with the insulating substrate 1 or the case 7. Since the other structures are identical to those in Embodiment 1, the detailed description will be omitted herein.

As illustrated in FIG. 4, the protruding portion 14 is in contact with the insulating substrate 1. As illustrated in FIG. 5, the protruding portion 14 is in contact with the case 7. Such structures can facilitate adjustment of the height of the protruding portion 14, which enables the size of the space 12 between the lid 11 and the sealing resin 10 to be easily controlled. The protruding portion 14 may be shaped like, for example, a cylinder, a quadrangular prism, or a triangle.

As described above, provision of the protruding portion 14 with the lid 11 enables the size of the space 12 between the lid 11 and the sealing resin 10 to be easily controlled according to Embodiment 3. This also facilitates design of the outside shape of the semiconductor device.

As illustrated in FIGS. 4 and 5, the protruding portion 14 is embedded in the sealing resin 10 to which the fire retardant is not added. Thus, the lid 11 can be more firmly fixed than those according to Embodiments 1 and 2.

The protruding portion 14 may be formed entirely or partially around the case 7. When the protruding portion 14 is formed partially around the case 7, the protruding portion 14 is preferably formed on at least three parts of the case 7. To discharge the gas generated from the sealing resin 10 to which the fire retardant is not added outside of the semiconductor device, a space may be provided in a portion where the case 7 is in contact with the lid 11.

Figure 6:
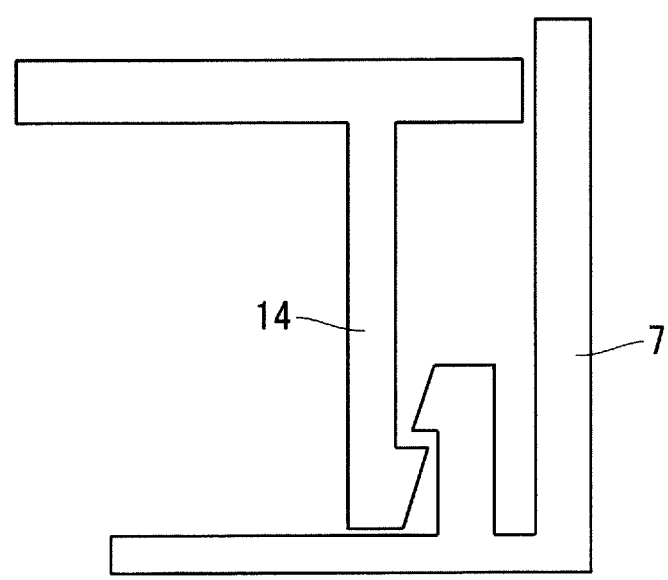
FIG. 6 is an enlarged view of a region B in FIG. 5.

As illustrated in FIG. 6, the protruding portion 14 and the case 7 may have respective claw portions. Engaging the claw portion of the protruding portion 14 in the claw portion of the case 7 will improve the workability. Each of the claw portions may be formed entirely or partially around the case 7. When each of the claw portions is formed partially around the case 7, the claw portion is preferably formed at at least three parts of the case 7. To discharge the gas generated from the sealing resin 10 to which the fire retardant is not added outside of the semiconductor device, a space may be provided in a portion where the case 7 is in contact with the lid 11.

Embodiment 4

Embodiment 4 of the present invention will describe a power conversion device to which the semiconductor devices according to Embodiments 1 to 3 are applied. Although Embodiment 4 is not limited to a specific power conversion device, Embodiment 4 will describe application of Embodiments 1 to 3 to a three-phase inverter.

FIG. 7 is a block diagram illustrating a configuration of a power conversion system to which the power conversion device according to Embodiment 4 is applied.

The power conversion system illustrated in FIG. 7 includes a power source 100, a power conversion device 200, and a load 300. The power source 100, which is a DC power source, supplies a DC power to the power conversion device 200. The power source 100 may include various types of components such as a direct current system, a solar battery, or a rechargeable battery, and may include a rectifying circuit connected to an AC system or an AC/DC converter. The power source 100 may include a DC/DC converter which converts a DC power output from a DC system into a predetermined power.

The power conversion device 200, which is a three-phase inverter connected between the power source 100 and the load 300, converts the DC power supplied from the power source 100 into the AC power to supply the AC power to the load 300. As illustrated in FIG. 7, the power conversion device 200 includes a main conversion circuit 201 which converts the DC power into the AC power, and a control circuit 203 which outputs, to the main conversion circuit 201, a control signal for controlling the main conversion circuit 201.

The load 300 is a three-phase electrical motor driven by the AC power supplied from the power conversion device 200. The load 300 is not limited to specific use but is the electrical motor mounted on various types of electrical devices. Thus, the load 300 is used as the electrical motor for, for example, a hybrid car, an electrical car, a rail vehicle, an elevator, or air-conditioning equipment.

The power conversion device 200 will be described in detail hereinafter. The main conversion circuit 201 includes switching elements and free-wheeling diodes (not shown). Switching of the switching element causes the DC power supplied from the power source 100 to be converted into the AC power. The AC power is then supplied to the load 300. The specific circuit configuration of the main conversion circuit 201 is of various types. The main conversion circuit 201 according to Embodiment 4 is a three-phase full-bridge circuit having two levels, and includes six switching elements and six free-wheeling diodes anti-parallel connected to the respective switching elements. The semiconductor device according to any one of Embodiments 1 to 3 is applied to at least one of the switching elements and the free-wheeling diodes in the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The main conversion circuit 201 includes a drive circuit (not shown) for driving each of the switching elements. The drive circuit may be embedded in a semiconductor module 202 or provided separately from the semiconductor module 202. The drive circuit generates drive signals for driving the switching elements of the main conversion circuit 201, and supplies the drive signals to control electrodes of the switching elements of the main conversion circuit 201. Specifically, the drive circuit outputs, to a control electrode of each of the switching elements in accordance with the control signal from the control circuit 203 to be described hereinafter, the drive signal for switching the switching element to an ON state and the drive signal for switching the switching element to an OFF state. The drive signal is a voltage signal (ON signal) equal to or higher than a threshold voltage of the switching element when the switching element is kept in the ON state. The drive signal is a voltage signal (OFF signal) equal to or lower than the threshold voltage of the switching element when the switching element is kept in the OFF state.

The control circuit 203 controls the switching elements of the main conversion circuit 201 to supply a desired power to the load 300. Specifically, the control circuit 203 calculates a time (ON time) when each of the switching elements of the main conversion circuit 201 needs to enter the ON state, based on the power which needs to be supplied to the load 300. For example, the main conversion circuit 201 can be controlled by performing PWN control for modulating the ON time of the switching elements in accordance with the voltage which needs to be output. Then, the control circuit 203 outputs a control instruction (control signal) to the drive circuit included in the main conversion circuit 201 so that the drive circuit outputs the ON signal to the switching element which needs to enter the ON state and outputs the OFF signal to the switching element which needs to enter the OFF state at each time. The drive circuit outputs the ON signal or the OFF signal as the drive signal to the control electrode of each of the switching elements in accordance with the control signal.

Since the semiconductor device according to any one of Embodiments 1 to 3 is applied to the switching elements and the free-wheeling diodes of the main conversion circuit 201 in the power conversion device according to Embodiment 4, the reliability can be increased.

Although Embodiment 4 describes the example of applying Embodiments 1 to 3 of the present invention to the three-phase inverter having the two levels, Embodiments are not limited thereto, but can be applied to the various power conversion devices. Although Embodiment 4 describes the power conversion device having the two levels, the power conversion device may have three or multiple levels. Embodiments of the present invention may be applied to a single-phase inverter when the power is supplied to a single-phase load. Embodiments of the present invention can be also applied to a DC/DC converter or an AC/DC converter when the power is supplied to a DC load, for example.

The load of the power conversion device to which Embodiments of the present invention are applied is not limited to the electrical motor as described above. The power conversion device can also be used as a power-supply device of an electrical discharge machine, a laser beam machine, an induction heat cooking device, or a non-contact power feeding system, and can be further used as a power conditioner of, for example, a solar power system or an electricity storage system.

Embodiments can be freely combined, and appropriately modified or omitted within the scope of the present invention.

What is claimed is:
1. A semiconductor device, comprising:
a semiconductor element disposed on an insulating substrate;
a case disposed around an outer edge of the insulating substrate, the case including an opening facing the semiconductor element;
a sealing resin sealing the semiconductor element in the case; and
a lid closing the opening of the case,
wherein the sealing resin does not contain a fire retardant, the lid contains the fire retardant, and
a space is provided between the sealing resin and the lid.
2. The semiconductor device according to claim 1,
wherein the lid includes a first protruding portion in contact with the case in an extension direction of the lid.
3. The semiconductor device according to claim 2,
wherein the first protruding portion and the case include respective claw portions engaging each other.
4. The semiconductor device according to claim 1,
wherein the lid includes a second protruding portion disposed vertical to an extension direction of the lid, and
the second protruding portion is in contact with the insulating substrate or the case.
5. The semiconductor device according to claim 4,
wherein the second protruding portion and the case include respective claw portions engaging each other.
6. The semiconductor device according to claim 1,
wherein a space is provided between the case and the lid.
7. The semiconductor device according to claim 1,
wherein the semiconductor element contains at least SiC or GaN.
8. A power conversion device, comprising:
a main conversion circuit including the semiconductor device according to claim 1, the main conversion circuit converting an input power to output a resulting power; and
a control circuit outputting, to the main conversion circuit, a control signal for controlling the main conversion circuit.

* * * * *